United States Patent
La Rosa

(10) Patent No.: US 7,031,212 B2
(45) Date of Patent: Apr. 18, 2006

(54) DOUBLE READ STAGE SENSE AMPLIFIER

(75) Inventor: Francesco La Rosa, Rousset (FR)

(73) Assignee: STMicroelectronics S.A., Montrouge (FR)

( * ) Notice: Subject to any disclaimer, the term of this patent is extended or adjusted under 35 U.S.C. 154(b) by 42 days.

(21) Appl. No.: 10/816,204

(22) Filed: Apr. 1, 2004

(65) Prior Publication Data
US 2004/0252568 A1 Dec. 16, 2004

(30) Foreign Application Priority Data
Apr. 2, 2003 (FR) .................................. 03 04077

(51) Int. Cl.
*G11C 7/00* (2006.01)
(52) U.S. Cl. ............... 365/205; 365/207; 365/185.21
(58) Field of Classification Search ............. 365/205, 365/207, 185.21, 189.09, 210
See application file for complete search history.

(56) References Cited
U.S. PATENT DOCUMENTS

| | | | |
|---|---|---|---|
| 5,175,705 A | 12/1992 | Iwahashi | 365/204 |
| 5,748,015 A | 5/1998 | Tam | 327/51 |
| 5,886,925 A * | 3/1999 | Campardo et al. | 365/185.21 |
| 6,501,697 B1 * | 12/2002 | Perner et al. | 365/209 |
| 6,590,804 B1 * | 7/2003 | Perner | 365/158 |
| 2002/0000841 A1 | 1/2002 | Rai et al. | 327/56 |

\* cited by examiner

*Primary Examiner*—Gene N. Auduong
(74) *Attorney, Agent, or Firm*—Lisa K. Jorgenson; Dennis M. de Guzman; Seed IP Law Group PLLC

(57) ABSTRACT

The present invention relates to a sense amplifier for reading a memory cell, comprising a read node linked directly or indirectly to the memory cell, a first active branch connected to the read node, comprising means for supplying a read current at the read node, and a data output linked to one node of the first active branch at which a voltage representative of the conductivity state of the memory cell appears. According to the present invention, the sense amplifier comprises a second active branch connected to the read node, comprising means for supplying, at the read node, a current that is added to the current supplied by the first active branch, such that the voltage representative of the conductivity state of the memory cell remains substantially stable upon a current draw at the read node. Application particularly to reading non-volatile FLASH and EEPROM type memory cells.

20 Claims, 4 Drawing Sheets

DOUBLE READ STAGE SENSE AMPLIFIER

FIELD OF THE INVENTION

The present invention relates to a memory cell sense amplifier, particularly applicable to EEPROM, FLASH-EEPROM, or other non-volatile memories. The present invention relates more particularly to a sense amplifier comprising a read node linked directly or indirectly to a memory cell, a first active branch connected to the read node, comprising means for supplying a read current at the read node, and a data output linked to one node of the first active branch at which a voltage representative of the conductivity state of the memory cell appears.

BACKGROUND OF THE INVENTION

To read a datum saved in a non-volatile memory cell, it is common to use a sense amplifier arranged for detecting the programmed or erased state of the memory cell by comparing the value of a current passing through the memory cell with a reference current. The fact that a memory cell is programmed or erased translates into a determined conductivity state of the memory cell, and conventionally corresponds to a determined value of the datum saved, such as 1 for the programmed state and 0 for the erased state for example.

FIG. 1 represents the architecture of a classical sense amplifier SA1. On this figure and in the rest of the present application, PMOS-type transistors are designated by references starting with "TP" and NMOS-type transistors are designated by references starting with "TN." The sense amplifier SA1 comprises a control stage CTLST1, a read stage RDST1 having a read node RND, and an output stage OUTST having an output SOUT, these stages being electrically powered by a voltage Vcc.

The control stage CTLST1 comprises transistors TP1, TP2, TN1 in series and a transistor TN2 in parallel with the transistor TN1. The transistor TP1 receives at its source the voltage Vcc, at its gate a reference voltage Vref and its drain is connected to the source of the transistor TP2. The transistor TP2 receives at its gate a signal ENABLE and its drain is connected to the drains of the transistors TN1, TN2 the sources of which are grounded. The gate of the transistor TN1 is connected to the read node RND, and the gate of the transistor TN2 receives the signal ENABLE.

The read stage RDST1 comprises a transistor TP3 and a cascode transistor TN3 in series with the transistor TP3. The transistor TP3 receives the voltage Vcc at its source and the voltage Vref at its gate. The drain of the transistor TP3 is connected to the drain of the transistor TN3, at which a voltage VMID1 that is applied to the output stage OUTST appears. The source of the transistor TN3 is connected to the read node RND, at which a voltage VSENSE appears. The gate of the transistor TN3 receives a cascode voltage VC1 taken off at the drain of the transistor TP2 of the control stage. The read stage RDST1 further comprises a precharge transistor TP4 the source of which receives the voltage Vcc, the gate of which receives a precharge control signal PRE and the drain of which is linked to the drain of the transistor TN3.

The output stage OUTST comprises an inverting gate INV receiving the voltage VMID1 at input. The output of this inverting gate is applied to the input of a latch, such as a D-type latch DL for example. The latch DL receives a latch signal LATCH at a control input H, and its output Q forms the output SOUT of the sense amplifier.

The read node RND is here linked to a non-volatile memory cell MCELL of a memory array MA, through a column decoder COLDEC and a bit line BLj. The memory cell comprises a floating-gate transistor FGT the source of which is linked to the ground and the gate of which receives a read voltage Vread during a read phase. The threshold voltage of the transistor FGT depends on its programmed or erased state and the read voltage Vread is chosen between the threshold voltage in the programmed state and the threshold voltage in the erased state. Therefore, when the voltage Vread is applied, the transistor FGT is in a high transmission state if it is in the programmed state (low threshold voltage) or is, on the other hand, in a low transmission state or even off if it is in the erased state (high threshold voltage).

The sense amplifier is inactive when the signal ENABLE is on 1 (Vcc) and the voltage Vref equal to Vcc. The transistor TN2 is then on, the transistor TP2 is off and the drain of the transistor TN1 is linked to the ground. No current is circulating in the control stage CTLST1. The transistors TP1, TP3 are off and no current is circulating in the read stage RDST1.

The reading of the memory cell is preceded by an address decoding phase, performed by the decoder COLDEC, allowing the bit line BLj to be linked to the read node RND.

The reading of the memory cell comprises a phase of precharging the bit line BLj, a phase of reading a datum, and a phase of latching the datum. As of the precharge phase, the voltage Vread is taken to an intermediate value between the threshold voltage of the transistor FGT in the programmed state and the threshold voltage of the transistor FGT in the erased state.

The sense amplifier SA1 is first of all activated by taking the voltage Vref to the value Vc−Vtp, Vtp being the threshold voltage of a PMOS transistor. The transistors TP1, TP3 then operate as current generators and respectively supply currents Ibias and Iref in their respective stages.

The precharge phase is engaged by setting the signals ENABLE and PRE to 0. The transistor TN2 goes off and the transistor TP2 becomes on. The voltage VC1 applied to the gate of the transistor TN3 increases and the latter becomes on. The transistors TP3, TP4 are also on and a precharge current is supplied at the read node RND. The transistor TP4 allows the precharge time to be reduced and, as a result, the overall read time, by supplying a precharge current higher than the one that the transistor TP3 alone could supply. This current allows stray capacitances to be charged that are located in the bit line BLj and the voltage VSENSE to be rapidly taken to a determined value, which is substantially equal to the threshold voltage Vtn of an NMOS transistor. Moreover, the limitation of the voltage VSENSE by the cascode transistor TN3 allows the floating-gate transistor FGT to be protected against a phenomenon called drain stress, which translates into an unintentional injection of charges into the floating gate of the transistor and causes spurious programming of the memory cell.

When the determined value of the voltage VSENSE is reached, the transistor TN1 becomes on. The voltage VC1 drops and stabilizes at a value such that, firstly, the currents in the transistors TP1, TN1 are identical and, secondly, the current supplied by the transistor TN3 to the read node corresponds to the current Icell imposed by the transistor FGT in the bit line.

At the end of the precharge phase, the voltage VMID1 is equal to the voltage Vcc minus the voltage drop in the transistor TP3 and the output of the inverting gate INV is on 0. The cascode control voltage VC1 has a value corresponding to the current Icell required by the memory cell.

The read phase as such starts by resetting the precharge signal PRE to 1 (Vcc), such that the transistor TP4 goes off.

If the transistor FGT is in the programmed state, the current Icell is higher than the current Iref supplied by the transistor TP3 (imposed by Vref). The voltage VMID1 is pulled towards the ground and the output of the inverting gate INV goes to 1. If the transistor FGT is in the erased state, the current Icell is low and lower than the current Iref. The transistor TN3 is in a low transmission state and the voltage VMID1 keeps its initial value close to Vcc, such that the output of the inverting gate remains on 0.

The signal LATCH is then applied to the latch DL and the datum supplied by the inverting gate is latched at the output SOUT of the sense amplifier. The latter is then stopped by resetting the signal ENABLE to 1 and by taking the voltage Vref to Vcc again.

Although this sense amplifier is satisfactory by its simplicity, it has the disadvantage of being sensitive to noise, particularly during the phase of reading a memory cell that is in the erased state. This noise can for example correspond to a spurious signal on the supply voltage Vcc due to a current draw created by the switching of logic circuits.

FIG. 2 shows the appearance of the voltages Vcc, Vref, VMID1, VC1 during the reading of a memory cell in the erased state (transistor FGT in a low transmission state), when the voltage Vcc has a spurious fluctuation taking the shape of a voltage drop C1 followed by a voltage peak P1. Before the occurrence of the voltage drop C1, the sense amplifier SA1 is in a stable state. The transistor TN3 is in a low transmission state. The voltage VSENSE is close to Vtn and the voltage VMID1 is close to Vcc. When the voltage drop C1 occurs, stray capacitances absorb the variations of the voltage Vref and the latter does not follow the very rapid variation of the voltage Vcc, the duration of which is for example in the order of approximately ten nanoseconds. Thus, the difference between the voltages Vref and Vcc decreases and becomes lower than the threshold voltage of the transistors TP1, TP3, which go off. As the transistor TP1 is off, the voltage VC1 drops and the transistor TN3 also goes off. The low current passing through the memory cell MCELL starts to discharge the bit line. Then, when the peak P1 occurs on the voltage Vcc, the difference between the voltages Vref and Vcc increases and the transistors TP1, TP3 rapidly become on. The voltage VC1 increases and exceeds the value it had before the occurrence of the voltage drop. The transistor TN3 becomes on with a gate-source voltage Vgs higher than its initial value, which causes a current draw in the bit line. If the current Icell required by the bit line is higher than the current Iref supplied by the transistor TP3, the voltage VMID1 drops as represented in FIG. 2. As a result, the output of the inverting gate temporarily goes to 1. If the datum is latched at this instant by the latch DL, the result of the read is false.

This risk of false reading is not limited to the example that has just been described. A similar risk exists particularly in the event of a temporary drop in the reference voltage Vref or the voltage VSENSE.

BRIEF SUMMARY OF THE INVENTION

The present invention aims to provide a sense amplifier that has a better noise immunity.

To achieve this object, and very schematically, the idea of the present invention is to provide means for injecting a supplementary current at the read node in the event of spurious current draw, so as to avoid the collapse of the voltage representative of the conductivity state of the memory cell.

Thus, the present invention provides a sense amplifier for reading a memory cell, comprising a read node linked directly or indirectly to the memory cell, a first active branch connected to the read node, comprising means for supplying a read current at the read node, and a data output linked to one node of the first active branch at which a voltage representative of the conductivity state of the memory cell appears, said sense amplifier comprising a second active branch connected to the read node and comprising means for supplying, at the read node, a current that is added to the current supplied by the first active branch, such that the voltage representative of the conductivity state of the memory cell remains substantially stable upon a current draw at the read node.

According to one embodiment, the first active branch is off and does not supply any current during the reading of an off or barely conductive memory cell.

According to one embodiment, the first active branch comprises a first current generator linked to the read node, and the second read branch comprises a second current generator linked to the read node.

According to one embodiment, the current generators comprise PMOS transistors driven by a common reference voltage.

According to one embodiment, the second current generator supplies a current higher than a current supplied by the first current generator.

According to one embodiment, the first current generator is linked to the read node through at least a first cascode transistor, and the second current generator is linked to the read node through at least a second cascode transistor.

According to one embodiment, the first current generator is linked to the read node through at least a first MOS transistor, while the second current generator is linked directly to the read node, the read node being connected to a voltage-limiting diode.

According to one embodiment, the amplifier comprises a stage for controlling the first and the second active branches.

According to one embodiment, the control stage controls the active branches such that a voltage appearing at the read node is regulated in the vicinity of a predetermined value.

According to one embodiment, the control stage controls the active branches such that the first active branch does not supply current while the current supplied by the second active branch does not supply the maximum value of the current it can deliver.

According to one embodiment, the control stage supplies a first gate control voltage to a first cascode transistor of the first active branch, and a second gate control voltage to a second cascode transistor of the second active branch, and the first and second control voltages are controlled by the control stage such that the gate source voltage of the second transistor is higher than the gate source voltage of the first transistor.

According to one embodiment, the first and second cascode transistors are N-type MOS transistors, and the second control voltage is higher than the first control voltage.

According to one embodiment, the control stage comprises a current generator in series with a load, the first control voltage is taken off at the cathode of the load, and the second control voltage is taken off at the anode of the load.

According to one embodiment, the load is a resistance.

According to one embodiment, the load is a MOS transistor.

According to one embodiment, the amplifier comprises a precharge transistor for supplying, during a precharge phase, a precharge current higher than the sum of the currents supplied by the first and the second active branches.

The present invention also relates to a non-volatile memory comprising a memory array comprising at least one memory cell, and at least one sense amplifier according to the present invention for reading the memory cell.

BRIEF DESCRIPTION OF THE SEVERAL VIEWS OF THE DRAWING(S)

These and other objects, features and advantages of the present invention will be explained in greater detail in the following description of an example of an embodiment of a sense amplifier according to the present invention, given in relation with, but not limited to the following figures:

FIG. 1 described above is the wiring diagram of a classical sense amplifier;

FIG. 2 described above represents the appearance of certain voltages appearing in the sense amplifier in FIG. 1 when the supply voltage has a spurious fluctuation;

DETAILED DESCRIPTION OF THE INVENTION

Figure 1:
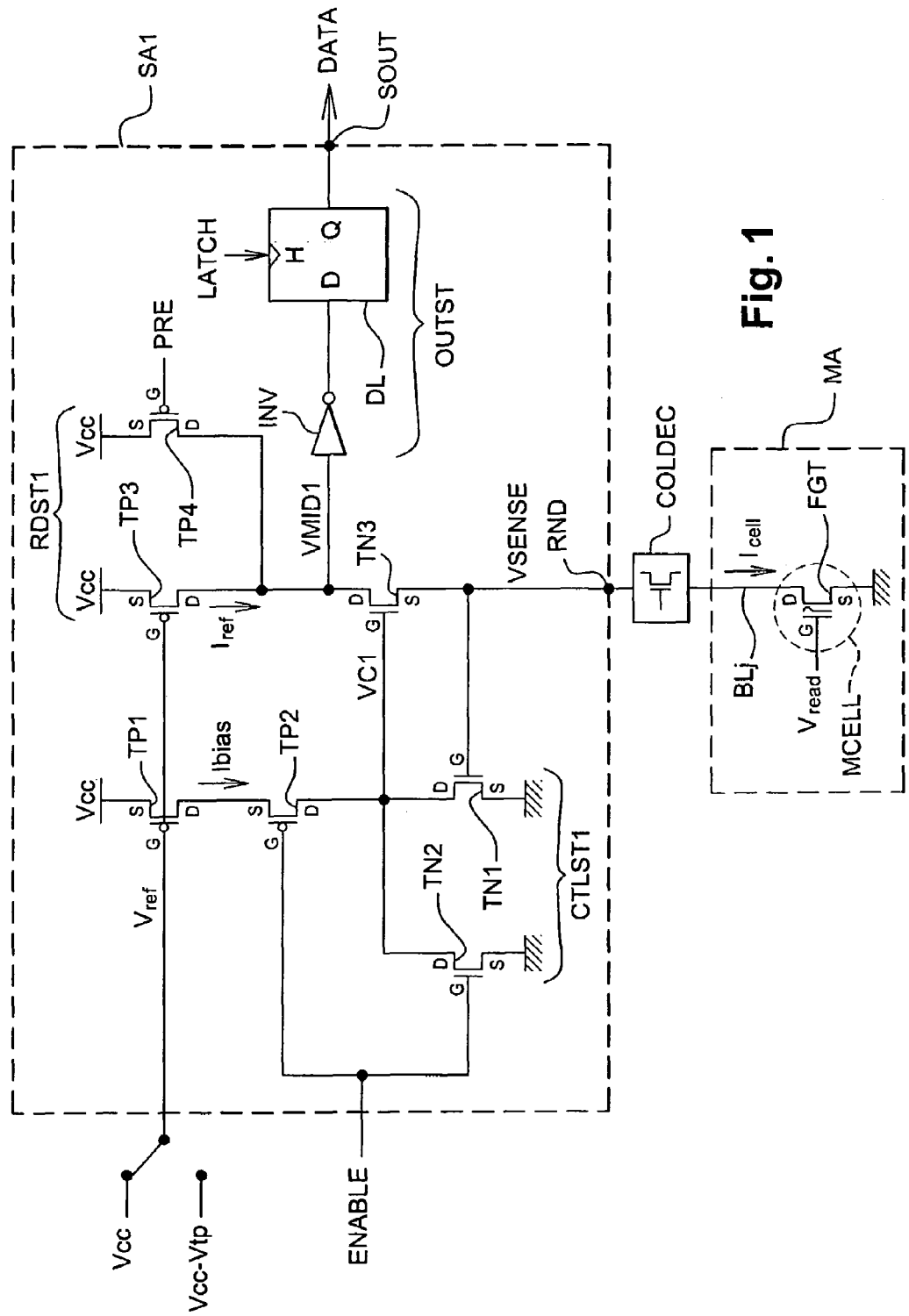
Figure 2:
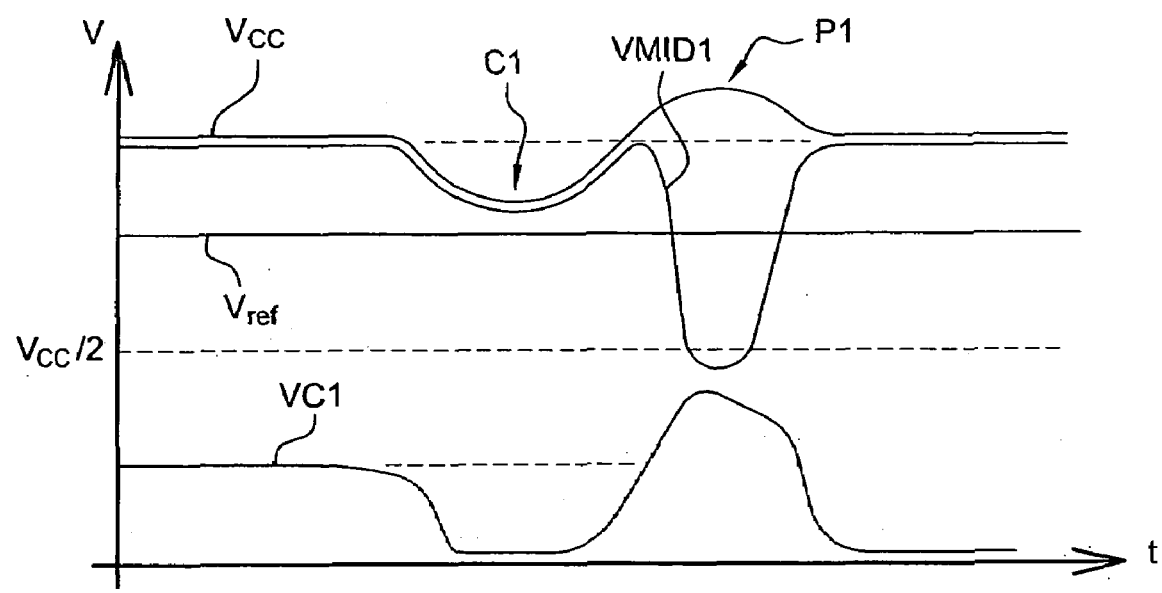
Figure 3:
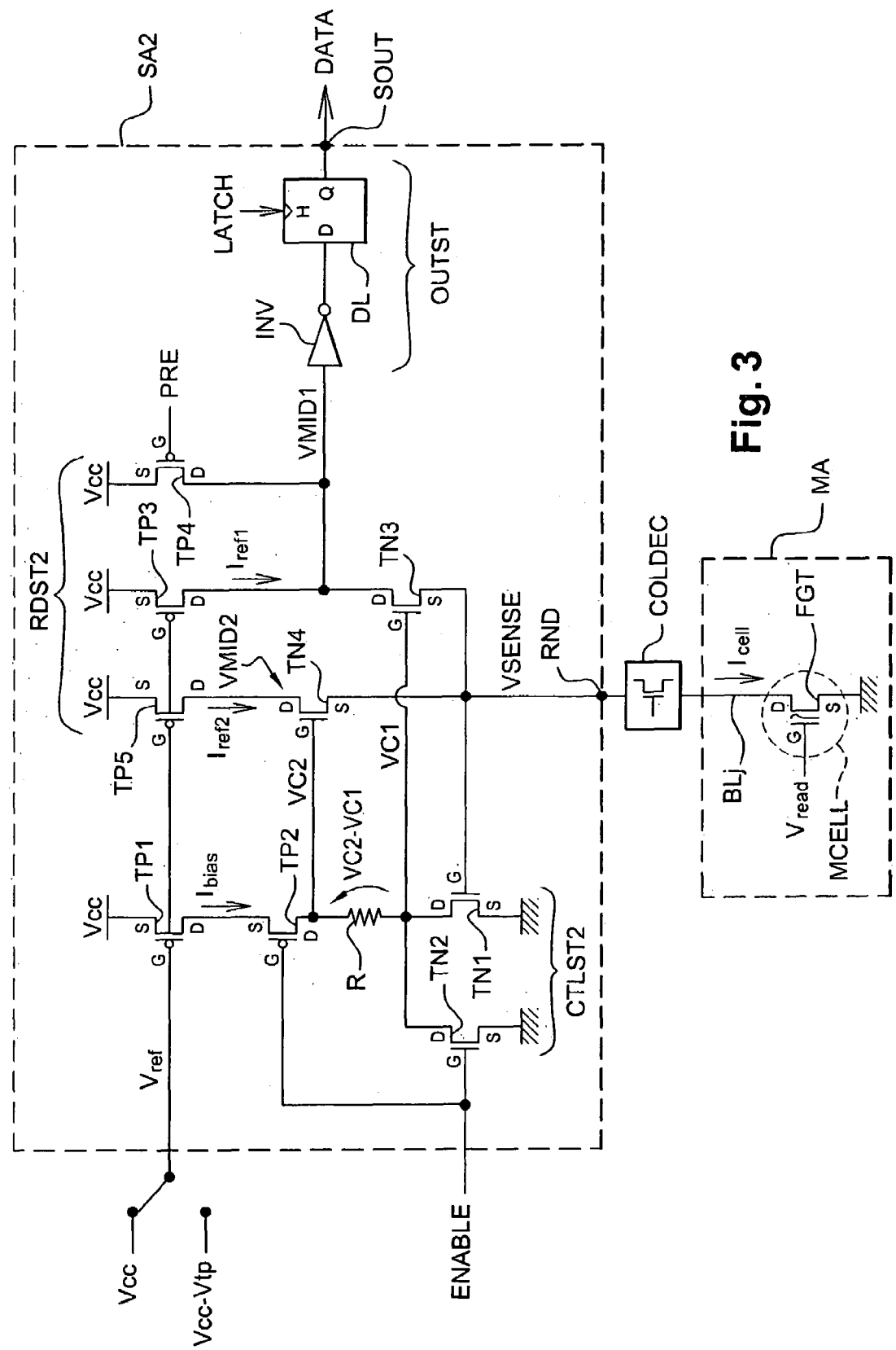
FIG. 3 is the wiring diagram of a first example of an embodiment of a sense amplifier according to the present invention.

FIG. 3 represents a sense amplifier SA2 according to the present invention. The elements described above in relation with FIG. 1 are designated by the same references.

The sense amplifier SA2 comprises a control stage CTLST2, a read stage RDST2 and an output stage OUTST. The output stage is identical to the output stage in FIG. 1. The sense amplifier is controlled, as above, by an activation signal ENABLE, a latch signal LATCH and a precharge signal PRE, and comprises a read node RND linked to the memory cell MCELL, as well as an output SOUT delivering a logic signal DATA on 1 (Vcc) or on 0 (ground) according to the conductivity state of the memory cell.

The control stage CTLST2 comprises, as above, the transistors TP1, TP2, TN1, TN2, arranged in the same way. Thus, the transistor TP1 receives the voltage Vcc at its source and the voltage Vref at its gate, the transistors TN2, TP2 receive the signal ENABLE at their gates, and the gate of the transistor TN1 is connected to the read node RND.

The read stage RDST2 comprises, like the stage RDST1 of the classical sense amplifier, the precharge transistor TP4 driven by the signal PRE, as well as the transistors TP3, TN3 in series, here forming a first active branch. The transistor TP3 receives the voltage Vcc at its source and the voltage Vref at its gate, the transistor TN3 receives at its gate the control voltage VC1 taken off at the drain of the transistor TN1 and its source is connected to the read node RND. A voltage VMID1 is taken off as above at the drain of the transistor TN3 (i.e. the drain of the transistor TP3) and is applied to the stage OUTST. This voltage VMID1 is representative of the conductivity state of the memory cell and is consequently representative of the datum stored in the memory cell.

According to the present invention, the read stage RDST2 comprises two transistors TP5, TN4 arranged in series forming a second active branch parallel to the one comprising the transistors TP3, TN3. The transistor TP5 receives the voltage Vcc at its source and the voltage Vref at its gate. Its drain is connected to the drain of the transistor TN4 the source of which is connected to the read node RND. The gate of the transistor TN4 receives a control voltage VC2 taken off at the drain of the transistor TP2 of the stage CTLST2. The drain voltage of the transistor TN4 is designated VMID2.

Furthermore, the control stage CTLST2 comprises a load, here a resistance R, that is arranged in series between the drain of the transistor TP2 and the drain of the transistor TN1. The difference VC2-VC1 between the two control voltages VC1, VC2 is therefore equal to the voltage difference appearing at the terminals of this resistance.

This second active branch of the read stage, formed by the transistors TP5, TN4, supplies to the read node RND a current Iref2 that is added to the current Iref1 supplied by the first active branch. Thanks to a suitable choice of W/L ratio (gate width to length ratio) of the transistor TP5 in relation to the W/L ratio of the transistor TP3, the current Iref2 can be chosen higher than Iref1.

Thanks to the resistance R, the gate-source voltage Vgs (TN4) of the transistor TN4 is higher than the gate-source voltage Vgs(TN3) of the transistor TN3, as it can be seen in the following relations:

$Vgs(TN3)=VC1-VSENSE$ $Vgs(TN4)=VC2-VSENSE=VC1+R*Ibias-VSENSE$ i.e.:

$Vgs(TN4)=Vgs(TN3)+R*Ibias>Vgs(TN3)$

Ibias being the current imposed by the transistor TP1 in the stage CTLST2.

Thus, when the drain voltage of the transistor TP2 drops, the transistor TN3 inevitably goes off before the transistor TN4 goes off, the two transistors having the same source voltage, the second causing the read voltage VSENSE to rise to put the first one off.

As above, the read node RND is linked to a memory cell MCELL through a column decoder COLDEC and a bit line BLj, and the memory cell comprises a floating-gate transistor FGT the gate of which receives a read voltage Vread that is between the threshold voltage of the transistor FGT in the programmed state and its threshold voltage in the erased state.

The sense amplifier SA2 is activated by taking the voltage Vref to Vcc-Vtp (Vtp being the threshold voltage of a PMOS transistor) and the precharge phase is engaged by setting the signals ENABLE and PRE to 0. The transistors TP1, TP3, TP5 operate like current generators and supply in their respective branches the currents Ibias, Iref1, Iref2, respectively. The transistor TN2 goes off and the transistor TP2 becomes on. The voltage VC1 increases and the transistor TN3 becomes on.

The transistor TP4 supplies most of the precharge current (assumed to be high as against Iref1 and Iref2) at the read node RND. When the voltage VSENSE reaches the above-mentioned determined value, that is substantially equal to the threshold voltage Vtn of an NMOS transistor, the transistor TN1 becomes on. The voltage at the gate of the transistor TN3 stabilizes itself. The currents in the transistors TP1, TN1 are identical. The sum of the currents supplied by the transistors TP3, TP4, TP5 corresponds to the current Icell required by the bit line.

At the end of the precharge phase, the transistor TN3 is off and the voltage VMID1 is equal to Vcc if the current Icell is lower than the current Iref2 supplied by the transistor TN4. The output of the inverting gate is on 0. If the current Icell is higher than the current Iref2, the transistor TN4 supplies the current Iref2. The transistor TN3 is on and supplies a current Iref1 corresponding to the current missing in the bit line, i.e., equal to Icell−Iref2. The voltage VMID1 is equal to Vcc minus the voltage drop in the transistor TP3. The output of the inverting gate INV is also on 0 in this case.

When the signal PRE is reset to 1(Vcc) to engage the read phase as such, the transistor TP4 goes off. The read node RND delivers in the bit line BLj a current Icell the intensity of which depends on the conductivity state of the transistor FGT. Here, three possibilities can be considered:

1) the current Icell is low and lower than the current Iref2 supplied by the supplementary branch according to the present invention (cell erased). In this case, there is no modification in relation to the precharge phase. The voltage Vgs of the transistor TN4 is maintained at a value such that this transistor supplies a current equal to Icell. The transistor TN3 is off and the voltage VMID1 is on Vcc. The output of the inverting gate is on 0.

2) the current Icell is higher than the current Iref2 (cell badly erased or erased cell having lost electric charges) and lower than Iref1+Iref2. In this case, the transistor TN4 supplies the current Iref2. The transistor TN3 is on and supplies the current missing in the bit line, i.e. Icell−Iref2. The voltage VMID1 is equal to Vcc minus the voltage drop in the transistor TP3. The output of the inverting gate INV remains on 0.

3) the current Icell is high and higher than Iref1+Iref2 (cell programmed). In this case, the transistors TN3, TN4 are on and each supply the maximum current they can supply at the node RND. The read node RND is pulled to the ground. The voltages VMID1, VMID2 both drop. The output of the inverting gate INV goes to 1.

The operation of the sense amplifier is therefore similar in some ways that of a classical sense amplifier. One difference is that when the memory cell is in a low transmission state, most of the current in the bit line is supplied by the transistor TN4 of the supplementary branch TP5/TN4 of the read stage instead of being supplied by the transistor TN3.

Figure 4:
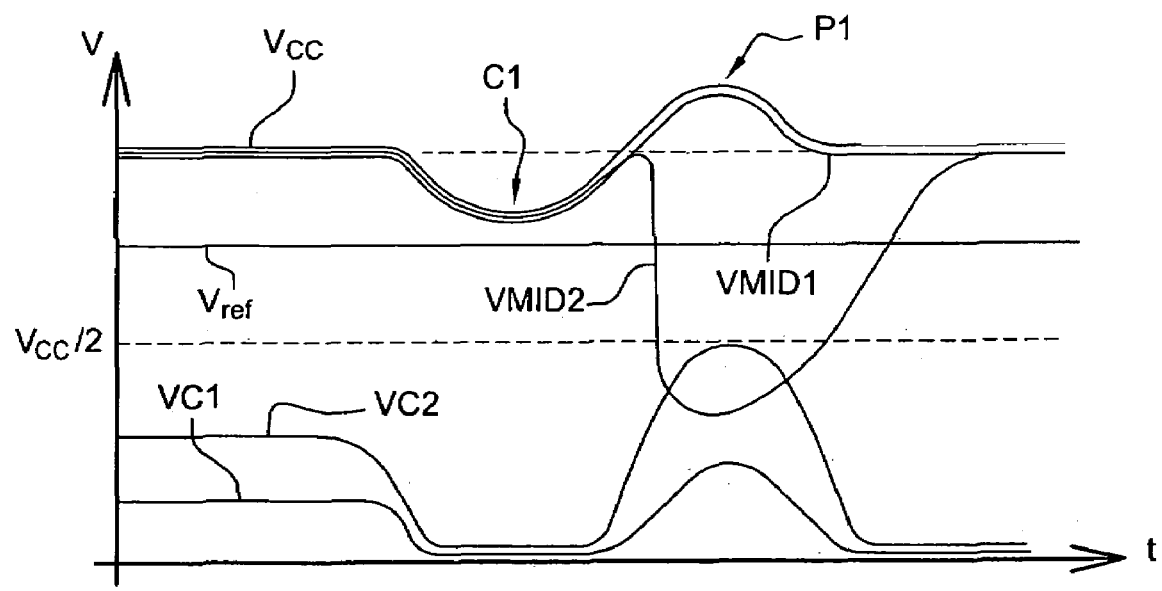
FIG. 4 represents the appearance of certain voltages appearing in the sense amplifier in FIG. 3 when the supply voltage has a spurious fluctuation.

The advantage of the supplementary branch TP5/TN4 will be understood with reference to FIG. 4, which shows the appearance of the voltages Vcc, VMID1, VMID2, Vref, VC1, VC2 when the voltage Vcc fluctuates and has a spurious signal during the reading of an erased memory cell. As above, this spurious signal here comprises a voltage drop C1 followed by a voltage peak P1.

Before the voltage drop C1, the sense amplifier SA2 is in a stable state. The transistors TN3, TN4 are in a low transmission state (or even in an off state for the transistor TN3, according to the value of Icell). The voltage VSENSE is close to Vtn and the voltage VMID1 is close to Vcc (or equal to Vcc if the transistor TN3 is off). The output of the inverting gate INV is therefore on 0.

When the voltage drop occurs, the voltage Vref remains stable since it cannot follow the variation of the voltage Vcc, due, for example, to stray capacitances absorbing the variations of the voltage Vref. The difference between the voltages Vref and Vcc decreases and the transistors TP1, TP3, TP5 go off. As the transistor TP1 is off, the voltages VC1, VC2 drop and the transistor TN4 goes off, the transistor TN3 already being off. A low current passing through the memory cell MCELL starts to discharge the bit line and the voltage VSENSE drops.

When the voltage peak occurs, the difference between the voltages Vref and Vcc increases above its initial value and the transistors TP1, TP3, TP5 become on. The voltages VC1, VC2 increase, the voltage VC2 being higher than the voltage VC1 due to the voltage drop in the resistance R. The transistor TN4 becomes on again and a current draw appears in the bit line. As the voltage VSENSE has dropped during the voltage drop, the transmission state of the transistor TN1 of the control stage is reduced such that the cascode control voltage VC2 increases considerably in response to the current draw. The supplementary current required by the bit line is supplied by the transistor TP5 while the transistor TN3 remains in a low transmission state or even off. The voltage VMID1 thus remains in the vicinity of Vcc and the output of the inverting gate remains on 0. If the datum read is latched at this instant, the result of the read is not false contrary to what was described above with reference to FIG. 1.

To limit the risk of a drop of the voltage VMID1 by making the transistor TN3 conductive upon the current draw, the choice will advantageously be made to define the gate width to length ratios of the transistors TP3, TP5 such that Iref2 is higher than Iref1, for example in a ratio 10.

It will be understood by those skilled in the art that various alternative embodiments and applications of the present invention may be made. In particular, the resistance R of the control stage CTLST2 can be replaced by a PMOS transistor the gate of which is linked to the ground. Moreover, the voltages VC1, VC2 controlling the transistors TN3, TN4 can be supplied by two distinct control stages, one being used to control the transistor TN3 and the other to control the transistor TN4.

Figure 5:
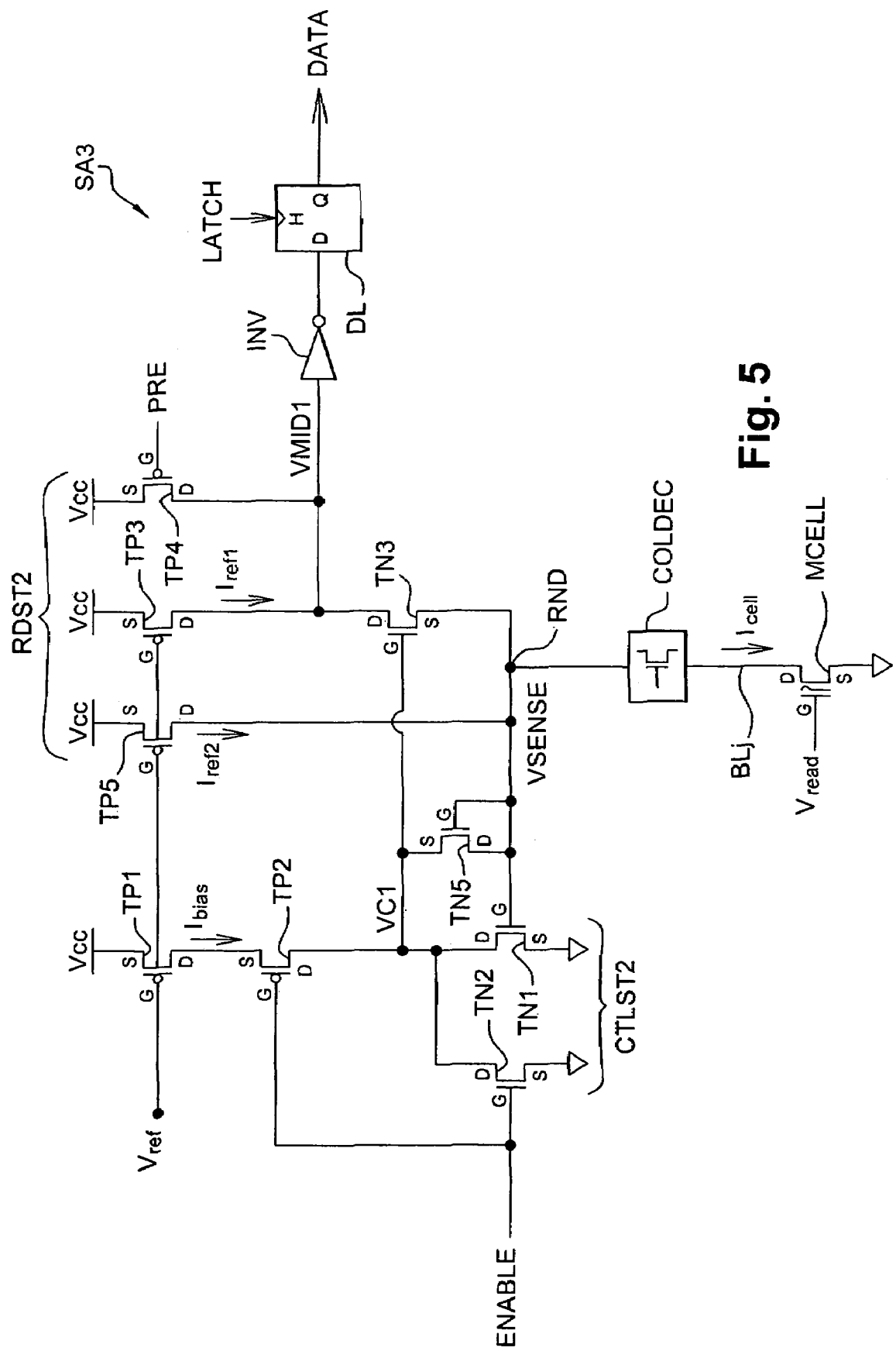
FIG. 5 is the wiring diagram of a second example of an embodiment of a sense amplifier according to the present invention.

FIG. 5 represents a second example of an embodiment of a sense amplifier SA3 according to the present invention. The second active branch of the stage RDST2 here only comprises the transistor TP5, the drain of which is directly linked to the read node RND, the cascode transistor TN4 thus being removed. This cascode transistor is here replaced by a diode transistor TN5 the function of which is also to limit the voltage VSENSE at the read node RND. The diode transistor TN5 has its gate and its drain connected to the read node RND (anode of the equivalent diode) and its source is connected to the drain of the transistor TN1 of the stage CTLST2 (that supplies the control voltage VC1).

The operation of the sense amplifier SA3 is thus as follows. When the bit line BLj has been precharged and a memory cell in the erased state has been selected in this bit line, the voltage VSENSE at the read node RND rises until the transistor TN3 is off ("Off" state). The node RND then continues to rise under the effect of the current Iref2 supplied by the transistor TP5, until the control voltage VC1 becomes zero (transistor TN1 on and drain of the transistor TN1 to the ground). The diode transistor TN4 then becomes on, and limits the voltage VSENSE at the node RND when the current that passes through it is equal to Iref2. The result obtained is the same as the one obtained with the sense amplifier SA2. The bit line is charged with a level of voltage that is higher than the one that could be obtained with the first active branch, formed by the transistors TP3, TN3. That guarantees that the transistor TN3 is firmly off.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A sense amplifier for reading a memory cell, comprising:
   a read node electrically coupled to the memory cell;
   a first active branch connected to the read node and comprising means for supplying a read current at the read node;
   data output linked to one node of the first active branch at which a voltage representative of a conductivity state of the memory cell appears; and
   a second active branch connected to the read node, comprising means for supplying, at the read node, a current that is added to the current supplied by the first active branch, such that the voltage representative of the conductivity state of the memory cell remains substantially stable upon a current draw at the read node.

2. The sense amplifier according to claim 1 wherein the first active branch is off and does not supply any current during the reading of an off or barely conductive memory cell.

3. The sense amplifier according to claim 1 wherein the first active branch comprises a first current generator linked to the read node, and the second read branch comprises a second current generator linked to the read node.

4. The sense amplifier according to claim 3 wherein the current generators comprise PMOS transistors driven by a common reference voltage.

5. The sense amplifier according to claim 3 wherein the second current generator supplies a current higher than a current supplied by the first current generator.

6. The sense amplifier according to claim 3 wherein the first current generator is linked to the read node through at least a first cascode transistor, and the second current generator is linked to the read node through at least a second cascode transistor.

7. The sense amplifier according to claim 3 wherein the first current generator is linked to the read node through at least a first MOS transistor, while the second current generator is linked directly to the read node, the read node being connected to a voltage-limiting diode.

8. The sense amplifier according to claim 1, further comprising:
   a stage for controlling the first and the second active branches.

9. The sense amplifier according to claim 8 wherein the control stage controls the active branches such that a voltage appearing at the read node is regulated in the vicinity of a predetermined value.

10. The sense amplifier according to claim 8 wherein the control stage controls the active branches such that the first active branch does not supply current while the current supplied by the second active branch does not supply the maximum value of the current it can deliver.

11. The sense amplifier according to claim 8 wherein:
    the control stage supplies a first gate control voltage to a first cascode transistor of the first active branch, and a second gate control voltage to a second cascode transistor of the second active branch, and
    the first and second control voltages are controlled by the control stage such that the gate source voltage of the second transistor is higher than the gate source voltage of the first transistor.

12. The sense amplifier according to claim 11 wherein:
    the first and second cascode transistors are N-type MOS transistors; and
    the second control voltage is higher than the first control voltage.

13. The sense amplifier according to claim 11 wherein:
    the control stage comprises a current generator in series with a load;
    the first control voltage is taken off at the cathode of the load; and
    the second control voltage is taken off at the anode of the load.

14. The sense amplifier according to claim 13 wherein the load is a resistance.

15. The sense amplifier according to claim 13 wherein the load is a MOS transistor.

16. The sense amplifier according to claim 1, further comprising a precharge transistor for supplying, during a precharge phase, a precharge current higher than the sum of the currents supplied by the first and the second active branches.

17. A non-volatile memory comprising a memory array comprising at least one memory cell, characterized in that it further comprises at least one sense amplifier according to claim 1 for reading the memory cell.

18. A sense amplifier for reading a memory cell, comprising:
    a read node that is electrically connectable to a first terminal of a memory cell;
    a first branch coupled to the read node, the first branch providing a first read current to the read node;
    a second branch coupled to the read node, the second active branch providing a second current to the read node;
    a data sense node coupled to the first branch;
    a voltage pick-up node within the first branch; and
    a sense output node coupled to the voltage pick-up node within the first branch.

19. The sense amplifier of claim 18 wherein the first and second currents are added such that a voltage at the data sense node representative of a conductivity state of the memory cell remains substantially stable upon current draw at the read node.

20. The sense amplifier of claim 18, further comprising a pair of transistors at each of the first and second branches to respectively provide the first and second currents.

* * * * *

UNITED STATES PATENT AND TRADEMARK OFFICE
CERTIFICATE OF CORRECTION

| | | |
|---|---|---|
| PATENT NO. | : 7,031,212 B2 | Page 1 of 1 |
| APPLICATION NO. | : 10/816204 | |
| DATED | : April 18, 2006 | |
| INVENTOR(S) | : Francesco La Rosa | |

It is certified that error appears in the above-identified patent and that said Letters Patent is hereby corrected as shown below:

Column 9 Claim 1
Line 16, "data output linked to one node of the first active branch at..." should read as --a data output linked to one node of the first active branch at...--.

Signed and Sealed this

Eighth Day of May, 2007

JON W. DUDAS
*Director of the United States Patent and Trademark Office*